United States Patent [19]

McGann

[11] 4,100,589
[45] Jul. 11, 1978

[54] MICROCIRCUIT DEVICE INCLUDING HYBRID CIRCUIT CARRIER

[75] Inventor: William Edward McGann, Satellite Beach, Fla.

[73] Assignee: Harris Corporation, Cleveland, Ohio

[21] Appl. No.: 830,601

[22] Filed: Sep. 6, 1977

Related U.S. Application Data

[63] Continuation of Ser. No. 596,853, Jul. 17, 1975, abandoned.

[51] Int. Cl.² .............................................. H05K 5/00
[52] U.S. Cl. ................................... 361/399; 361/401; 361/418
[58] Field of Search .............. 361/400, 401, 403, 418; 29/589; 333/12; 357/81; 228/208

[56] References Cited

U.S. PATENT DOCUMENTS

| | | | |
|---|---|---|---|
| 3,549,949 | 12/1970 | Grandberry | 361/400 |
| 3,706,915 | 12/1972 | Lootens et al. | 357/81 |
| 3,784,726 | 1/1974 | Smith et al. | 317/100 |
| 3,860,949 | 1/1975 | Stoeckert et al. | 29/589 |
| 3,870,974 | 3/1975 | Ohlstein | 333/12 |

*Primary Examiner*—David Smith, Jr.

[57] ABSTRACT

A microcircuit device including a housing and at least one substrate. A carrier is provided having a surface for receiving the substrate. Fastening means, for example, screws are utilized to removably retain the carrier in a housing. Mounting means for the substrate may be provided including reservoir means for receiving a flow of excess bonding material from the mounting means-substrate interface.

7 Claims, 7 Drawing Figures

MICROCIRCUIT DEVICE INCLUDING HYBRID CIRCUIT CARRIER

This is a continuation of application Ser. No. 596,853 filed July 17, 1975, now abandoned.

BACKGROUND OF THE INVENTION

The present invention relates to mounting means for a substrate in a microcircuit device and to a microcircuit assembly in which a carrier is utilized for mounting a substrate with respect to a housing.

Microcircuit devices include at least one substrate in a housing. As used in the present description, the term "substrate" means a block of material, such as beryllium oxide, having a hybrid circuit or other circuit means formed on an upper surface thereof. Another term typically used to characterize substrates in the art is "chips." Substrates must be reliably mounted in housings for purposes of electrical characteristics, mechanical integrity, and proper heat transfer from the substrate. Commonly, substrates are mounted to a housing or to a bonding pad in a housing, thus becoming permanently affixed to the housing. Certain disadvantages arise from this conventional procedure. An example is a microwave transmitter including a plurality of substrates. In one form of typical transmitter, five substrates may be mounted in a housing. Each substrate is tested individually, and then bonded in a housing. Once bonded, interconnections are provided between substrates and from one or more substrates to housing terminals. Once completely assembled, the microwave transmitter must be tested. If individually operative substrates do not interact properly, or if a substrate becomes defective, it is necessary to remove one or more substrates. Removal of one or more substrates can result in permanent damage to substrates such that they are no longer usable. Removal operations may also endanger the operability of other substrates in the housing. This becomes particularly significant in a typical microwave transmitter applications, for example, in which the cost of producing a machined housing may be $200, and the cost of substrates placed thereon may be $8,000. It is therefore desirable to provide means for interchangeability of substrates in a housing.

Additionally, it is highly important that a reliable interface be provided between a lower surface of a substrate and the mounting means to which it is bonded. Substrates are generally made of fired ceramic material having a flat lower surface. While the lower surface may remain flat after firing, there is a tendency to warp. In a typical substrate one inch long, there may be as much as 0.0015 inches of twist in the substrate with respect to a flat plane. Even such a low degree of twist may result in an interface between the lower surface of the substrate and a mounting surface wherein portions of the substrates do not touch the mounting surface. Areas of discontinuity of mating, though small, may adversely affect electrical operations of the substrate, particularly in the case of substrates comprising microwave circuits. While voids may be filled by bonding material, the use of excess bonding material may cause disontinuities due to non-uniform distribution. In some forms, a substrate has a ground plane formed on a lower surface thereof. The ground plane may consist of a layer of gold alloy. It is desirable to prevent damage to this layer during bonding. If gold is removed from the ground plane during bonding, electrical properties of the substrate may be adversely affected.

SUMMARY OF THE INVENTION

It is therefore an object of the present invention to provide a microcircuit device in which a substrate may be reliably removed from a housing.

It is also an object of the present invention to provide a microcircuit device in which individual circuit substrates are replaceable within a housing.

It is also an object of the present invention to provide assemblies of the type described in which substrates are reliably mounted.

It is another object of the present invention to provide a carrier for mounting a substrate which carrier is easily assemblable and removable in a microwave device.

It is another object of the present invention to provide a mounting means for a substrate having high thermal conductivity, low resistivity and low inductance.

It is yet another object of the present invention to provide mounting means for a substrate including reservoir means for accomodating the flow of excess bonding material between a substrate and the mounting surface while providing for electrically and mechanically reliable mounting.

It is also another object of the present invention to provide a mounting surface of the type described in which gold scavenging from a substrate ground plane is prevented in bonding the substrate to a mounting surface.

Briefly stated, in accordance with the present invention in a microcircuit device, a carrier is provided having an upper surface for receiving a substrate and a lower surface for mating with a housing. The carrier includes fastening means so that the substrate may be removably mounted to the housing. The invention also contemplates provision of mounting means including reservoir means such that preformed or other bonding material may be placed between a substrate and a mounting surface for accomodating the flow of excess bonding material from the substrate-mounting surface interface.

BRIEF DESCRIPTION OF THE DRAWINGS

The means by which the foregoing objects and features of novelty are achieved are pointed out with particularlity in the claims forming the concluding portion of the specification. The invention, both to its organization and manner of operation, may be further understood by reference to the following description taken in connection with the following drawings.

Of the drawings

DESCRIPTION OF THE PREFERRED EMBODIMENT

Figure 1:
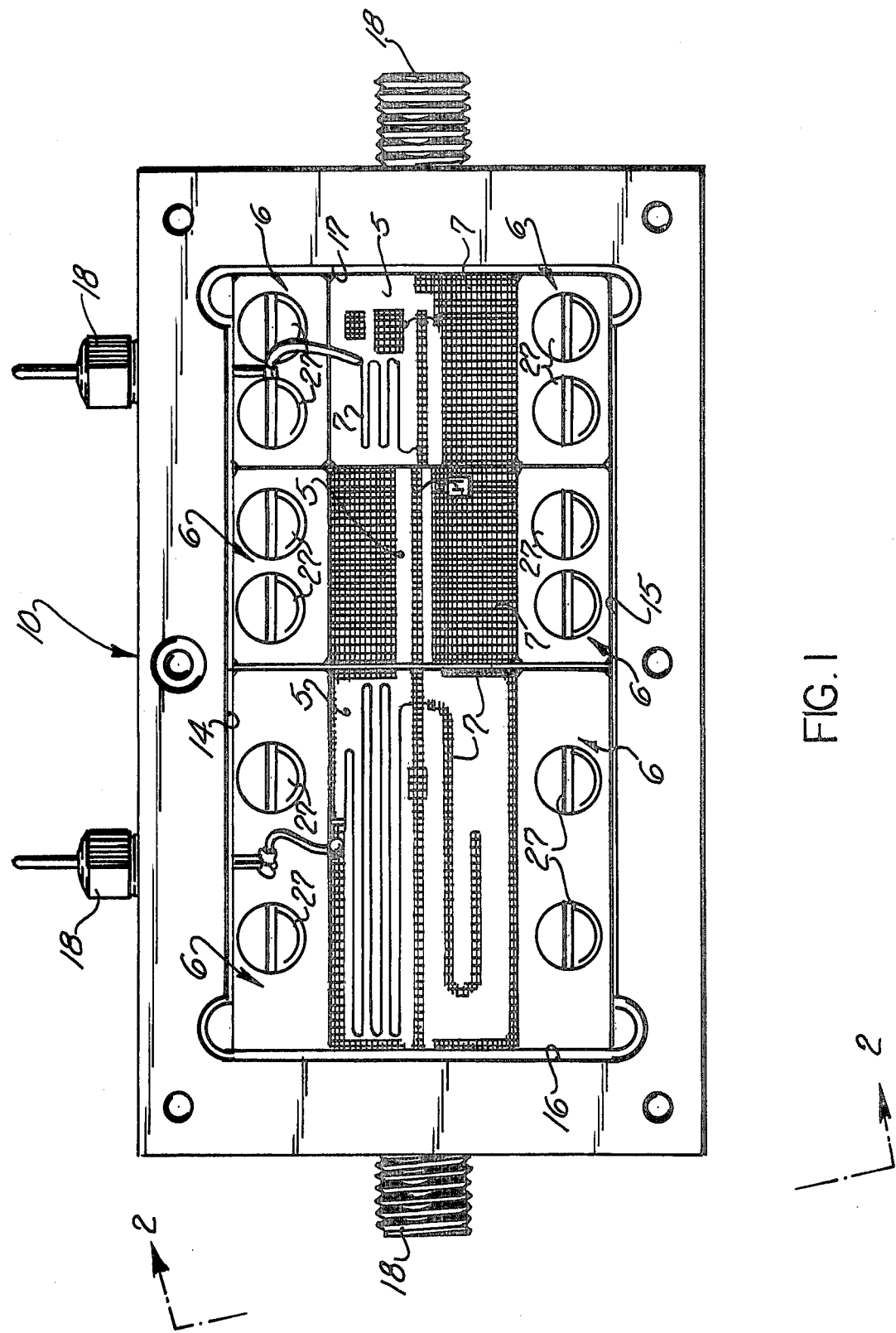
FIG. 1 is a plan view of a microcircuit device constructed in accordance with the present invention, having its top cover removed.
Figure 2:
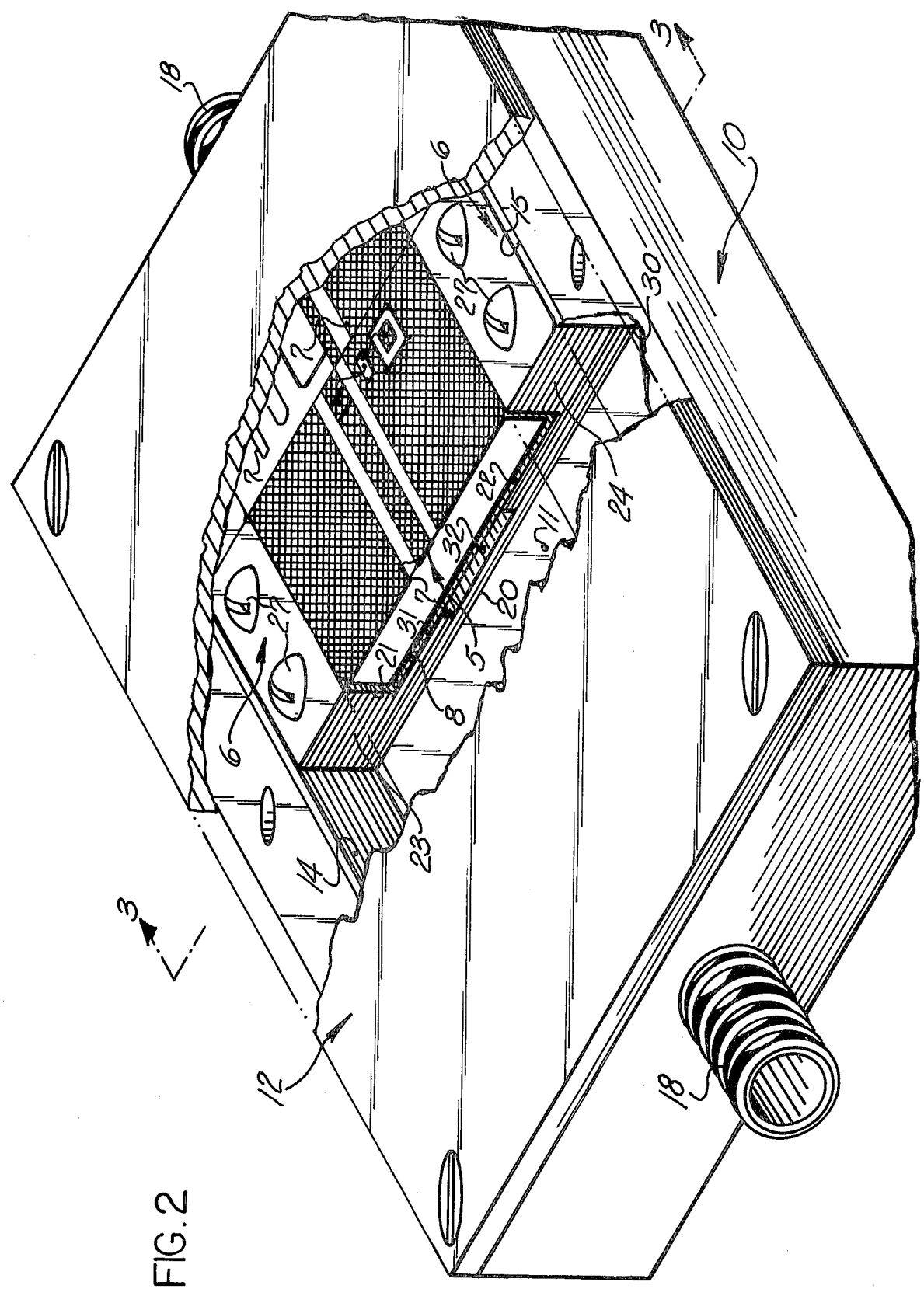
FIG. 2 is an axonometric illustration partially broken away illustration, of a microcircuit device constructed in accordance with the present invention viewed as defined by line 2—2 of FIG. 1.

Referring to FIG. 1 and 2, a microwave device, comprising a transmitter constructed in accordance with the present invention is illustrated. FIG. 1 is a plan view of the device with its top cover removed. FIG. 2 is an axonometric view taken along line 2—2 of FIG. 1 and partially broken away to show interior details. A plurality of substrates 5 are provided. Each substrate comprises a chip which may contain a hybrid microcircuit, discrete component or other circuit means. Each substrate 5 is respectively secured to a carrier for mounting in a housing 10 to a base 11 thereof. The housing 10 is closed by a cover 12.

Each substrate 5 has an upper surface 7 on which circuitry is formed and a lower surface 8. As described below, the invention provides for reliable mechanical and electrical mounting of each substrate 5 with respect to the housing 10 while permitting interchangeability of substrate 5. Therefore, if one substrate 5 is damaged, or if a number of substrates 5 do not interact properly, the situation may be remedied by simple replacement of a substrate 5 without danger of damage to an entire device, such as a microwave transmitter. The present invention is described with respect to one substrate 5 and one carrier 6, since each substrate 5 may be mounted in a similar manner, and since each of the substrates 6 may be constructed similarly.

The housing 10 is discussed in greater detail with reference to FIGS. 1 and 2 and also with reference to FIG. 3, which is a cross-sectional view taken along the line 3—3 of FIG. 2. The base 11 forms the base of a U-shaped chamber extending longitudinally in the housing 10 and and defining laterally opposite sidewalls 14 and 15 longitudinally opposite endwalls 16 and 17. The substrates 5 are interconnected by conventional means (not shown, for simplicity in the drawing) and are coupled to conventional signal input, signal output and power supply means which are indicated in FIG. 1 (for simplicity of the drawings) as terminals 18.

The carrier 6 is of a material having electrical and/or mechanical properties selected for a particular application. For example, the carrier 6 may be made of high thermal conductivity copper in order to provide for most efficient heat transfer from a substrate 5 to the base 10. The carrier 6 may be made of any one of a number of well-known materials selected for approximating the temperature coefficient of expansion of the substrate 5, particularly in applications in which thermal shock is a significant consideration. The carrier 6 has a lower surface 20 for mating with the base 11 of the housing 10 and an upper surface 21 for mating with the lower surface 8 of the substrate 5 to provide an interface 22. The upper surface 21 thus comprises mounting means for a substrate 5. Lands 23 and 24 are provided, projecting upwardly at opposite lateral sides of the upper surface 21 and extending longitudinally. The lands 23 and 24 define a substrate-receiving recess on the upper surface 21. It is preferably that facing vertical surfaces of the lands 23 and 24 be dimensioned to provide a very small clearance between their facing vertical sides and the substrate 5 to provide for convenient alignment of the substrate 5 on the carrier 6. Securing means 26 are provided for securing the carrier 6 to the base 11 of the housing 10. In the present embodiment, the securing means 26 comprises a plurality of apertures 26 each extending from the upper surface 21 to the lower surface 20 of the carrier 6. Each aperture 26 extends through a land 23 or 24. Each aperture 26 cooperates with fastening means 27. The fastening means 27 may comprise, for example, machine screws, each extending through an aperture 26 to bolt the carrier 6 onto the housing 10. A tap 28 may be provided in the upper surface 11 in registration with each aperture 26 to receive each screw 27. Other fastening means known in the art may be used. However, it is preferred that the fastening means 27 provide for removable mounting of the carrier 6. To enhance heat transfer between the substrate 5 and the housing 10, a layer of well-known thermally conductive grease 30 is placed to fill any voids between the lower surface 20 of the carrier 6 and the base 11 of the housing 10.

The substrate 5 is bonded to the carrier 6 with bonding material 31. In FIG. 3 the substrate 5 is illustrated already bonded onto the upper surface 21 of the carrier 5. In the preferred form, a preform of bonding material 31 is utilized. The bonding process is further described with respect to FIGS. 6 and 7 below with respect to an embodiment employing the same bonding process as the embodiment of FIG. 2. An excess of bonding material presents disadvantages. For example, excess bonding material can cause raised portions of the lower surface 8 of the substrate 5 with respect to the upper surface 21 of the carrier 6, leaving gaps therebetween. Additionally, bonding material may flow laterally past the edges of the substrate 5 creating areas of bonding material which may have a tendency to create electrical distrubances due to their inductance. The term "excess bonding material" means an amount of bonding material sufficient to cause the potential problems enumerated above or similar problems.

Therefore, in accordance with the present invention, reservoir means 32 are provided in the upper surface 21 of the carrier 6. The reservoir means 32 comprises means for receiving the flow of excess bonding material away from the lower surface 8 of the substrate 5.

The reservoir means 32, may, for example, comprise a longitudinal groove extending the length of the carrier 6. In order to serve the purpose as reservoir means, the longitudinal group 32 should be a non-capillary groove. Where a preselected substrate 5 to be placed on a carrier 6 is a microwave oscillator, care should be taken that the groove 32 is not formed in registration with a transmission line or other portion of a circuit such as to cause unwanted oscillations. The reservoir means 32 may take many other forms than a groove. For example, a number of pockets may be provided in place of one groove. Alternatively, the upper surface 21 may be coined to provide reservoir means 32.

Figure 3:
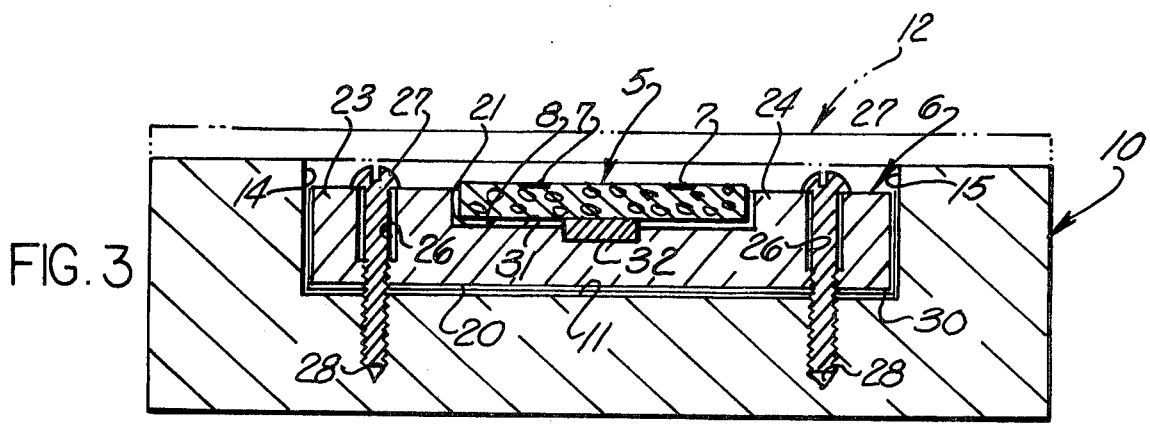
FIG. 3 is a sectional view taken across line 3—3 of FIG. 2.
Figure 4:
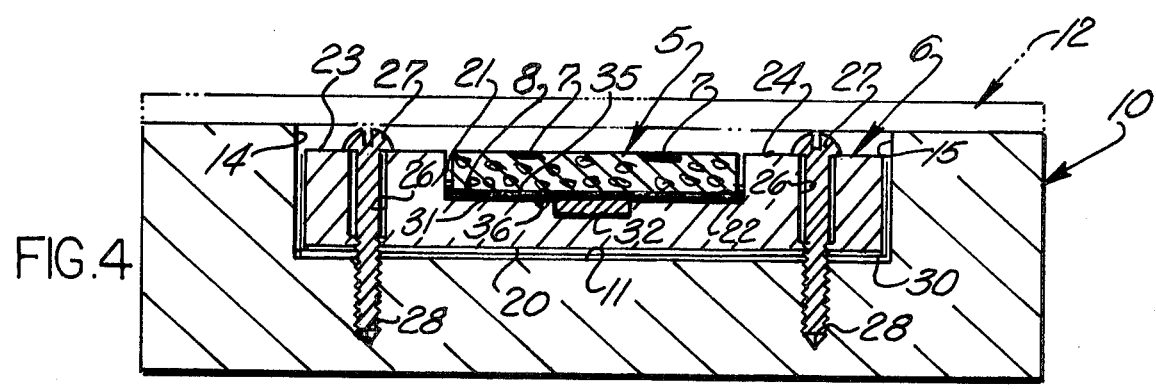
FIG. 4 illustrates a further embodiment of the invention illustrated in FIGS. 1-3.

FIG. 4 is an embodiment similar to FIG. 3, and the same reference numerals are used to denote corresponding elements. In the present embodiment, the lower surface 8 of the substrate 5 comprises a ground plane consisting of a layer of chrome-gold alloy or other known ground plane material. Commonly, in bonding a ground plane to a mounting surface, gold starving or scavenging, i.e., the removal of gold from a ground plane to a mounting surface during the bonding process, may result. In order to prevent gold starving from the lower surface 8, intermediate materials are utilized. These intermediate materials comprise a chrome strike 35 placed against the lower surface 8 and a copper barrier layer 36 placed between the chrome strike 35 and the upper surface 21 of the carrier 6. The chrome strike 35 is an adhesive layer bonding the substrate 5 to the copper barrier layer 36, and bonding material 30 used between the copper layer 36 and the upper surface 21 as in the embodiment of FIG. 3.

Figure 5:
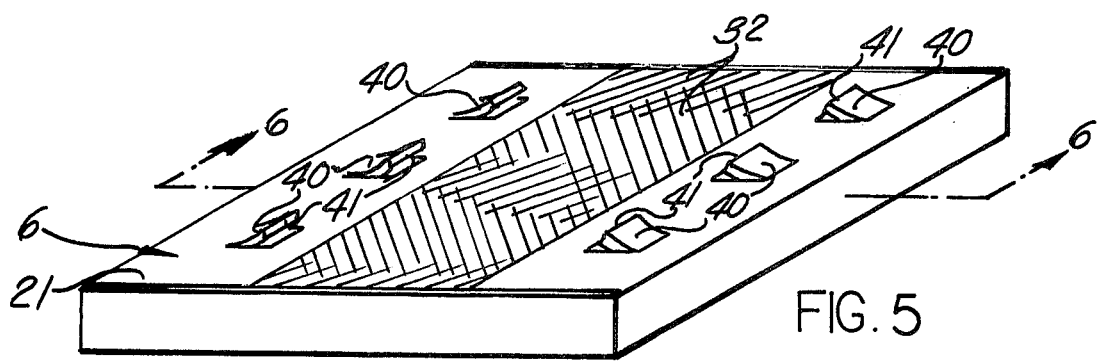
FIG. 5 is an axonometric view of another form of carrier constructed in accordance with the present invention.
Figure 6:
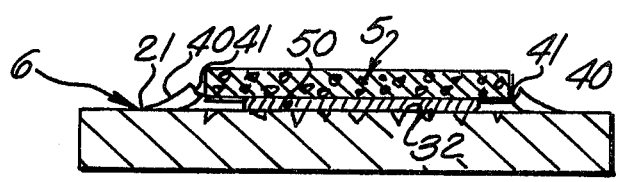
FIG. 6 is a cross-sectional view taken along the line 6—6 of FIG. 5 further illustrating a substrate and preform before bonding.
Figure 7:
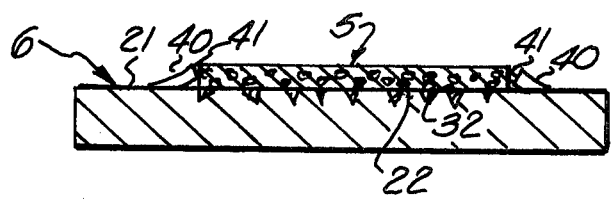
FIG. 7 is a view similar to FIG. 6 illustrating a substrate bonded to mounting means.

Referring now to FIG. 5, there is illustrated a substrate 6' which is a further embodiment of the substrate 6 of the embodiment of FIGS. 1–4. FIGS. 6 and 7 are sectional views of the substrate 6' taken along lines 6—6 of FIG. 5 and further illustrating the bonding of a substrate and the carrier 6'. The same reference numerals are used to denote the elements corresponding to those in FIGS. 1–4. In the embodiment of FIGS. 6 and 7 the upper surface 21 of the carrier 6' does not comprise lands 23 and 24. Rather, locator tabs 40 are provided and selected to be in registration with the lateral sides of a predetermined substrate 5. The locator tabs 40 may be conveniently formed by applying an appropriately shaped punch (not shown) to the lower surface 20 of the substrate 6' and pushing toward the upper surface thereof until the appropriate locator tabs 40 are formed. In the embodiment of FIG. 4, the reservoir means 32 formed in the upper surface 21 comprises a coined surface. The locator tabs 40 having inwardly directed surfaces 41 for locating the substrate 5 on the upper surface 21 on the carrier 6'. In the present context, the term "inwardly" implies inwardly with respect to the lateral sides of the carrier 6' and facing the substrate 5.

The bonding of a substrate 5 to a carrier 6' is illustrated in FIGS. 6 and 7. In the preferred form, as seen in FIG. 6 a preform 50 of bonding material is placed on the upper surface 21. The preform 50 may comprise conventional eutectic solder, low temperature antimony alloys in a conductive epoxy or other well-known bonding materials.

In order to bond the substrate 5 to the carrier 6', the elements as shown in FIG. 6 are typically heated in an oven at a temperature of 600° to 700° C. The preform 50 liquefies and flows wetting below surface 8 of the substrate 5 and the upper surface 21 of the carrier 6'. Due to the wetting action and due to gravity, the substrate 5 pushes down on the bonding material 50 to reach the final position shown in FIG. 7 in which it is bonded to the carrier 6'. In some applications, a substrate 5 may be pressed against the carrier 6' by conventional means (not shown). The size of the preform 50 is chosen with respect to the size of the substrate 5 such that bonding material flows to fill high and low spots in the reservoir means 32 whereby a gap-free, reliable electrical and mechanical bond is provided at the interface 22 of the substrate 5 and carrier 6'. During the bonding process, the locator tabs 40 align the substrate 5.

What is thus provided is carrier for use in a microcircuit device providing for reliable mounting of a substrate in a housing but permitting removal of the substrate from the housing if desired without damage to the substrate or to the housing or to other substrates that may be included in a housing. Additionally, an improved mounting means for receiving a substrate is provided.

What is claimed is:

1. A microcircuit device comprised of: a plurality of substrates each having circuitry formed thereon and each of which must be placed in a certain predetermined alignment with respect to at least another of said substrates; a plurality of carriers each associated with a respective substrate and each having a bonding surface to which the respective substrate is to be secured, the boundaries of said bonding surfaces in each case being defined by locating members which are associated with and extend outward from said bonding surface of said carriers, said locating members being spaced apart on said bonding surface by a distance closely matching a longitudinal dimension of said respective substrate, said substrate being positioned therebetween, and closely received thereby so as to provide a certain predetermined alignment, established by the position of said locating members, between each of said substrates and its respective carrier; bonding material for securely bonding each of said substrates to its respective carrier in said predetermined alignment established by said locating members; a housing including a base for partially enclosing all of said carriers and their respective substrate and a cover which may be removably connected to the base to complete the enclosure of said carriers and substrates; and, securing means for removably securing each of said carriers to said base of said housing in preselected positions with respect to one another which have been selected so that the cooperative result of the alignment of said substrates with respect to said carriers and said carriers with respect to said housing is such as to provide the required alignment of said substrates with respect to one another, whereby each said substrate is properly aligned and is readily replaceable within said housing.

2. A microcircuit device according to claim 1 wherein at least one of said carriers has a bonding surface having non-capillary reservoir means formed therein, said reservoir means providing a reservoir for receiving excess molten bonding material between said substrate and said carrier during bonding and further wherein said non-capillary reservoir means is dimensioned to receive a great enough volume of said excess bonding material that a sufficient amount of said bonding material may be placed between said substrate and said carrier to provide substantially a void-free bond, and excess bonding material flows away from an interface between said substrate and said carrier, whereby excess bonding material is not present in the bond between said substrate and said carrier.

3. A microcircuit device according to claim 2 wherein said reservoir means comprises a single groove cut in the upper surface of said carrier, said single groove being dimensioned to receive said great enough volume of said excess bonding material.

4. The device of claim 2 wherein said substrate is composed of an electrically insulating material and includes a layer of conductive material attached to the lower surface thereof which serves as a ground plane for said substrate, said device further comprising a metallic barrier layer interposed between said ground plane of said substrate and said carrier; means for bonding said barrier layer to said ground plane; and means for bonding said barrier layer to said carrier, whereby scavenging of conductive material from said ground plane of said substrate to said carrier is prevented.

5. A microcircuit device comprising: a substrate for having circuitry formed on the top surface thereof and having a bottom surface which is possibly warped; a mounting means having a surface to which said bottom surface of said substrate is to be bonded, said mounting means having at least one non-capillary reservoir formed in said surface thereof for receiving flow of excess molten bonding material during bonding of said substrate to said mounting means, said at least one reservoir being dimensioned to receive a great enough volume of said excess bonding material that sufficient bonding material may be placed between said substrate and said mounting means to provide a reliable electrical and mechanical bond regardless of said possible warping of said bottom surface of said substrate, and a resulting bond which does not contain excess bonding material at the substrate-mounting means interface.

6. The device according to claim 5 wherein said reservoir means comprises a longitudinally extending groove.

7. The device according to claim 5 wherein said reservoir means comprises a coined surface having an area approximately equal to that of a selected substrate.

* * * * *